United States Patent
Löffler

(10) Patent No.: US 6,711,082 B1
(45) Date of Patent: Mar. 23, 2004

(54) METHOD AND IMPLEMENTATION OF AN ON-CHIP SELF REFRESH FEATURE

(75) Inventor: Steffen Löffler, Essex Junction, VT (US)

(73) Assignee: Infineon Technologies, AG (DE)

( * ) Notice: Subject to any disclaimer, the term of this patent is extended or adjusted under 35 U.S.C. 154(b) by 0 days.

(21) Appl. No.: 10/299,026

(22) Filed: Nov. 18, 2002

(51) Int. Cl.$^7$ .................................................. G11C 7/00
(52) U.S. Cl. ........................ 365/222; 365/236; 365/225.7
(58) Field of Search ................................ 365/222, 236, 365/225.7

(56) References Cited

U.S. PATENT DOCUMENTS

| | | | |
|---|---|---|---|
| 5,402,390 A | 3/1995 | Ho et al. ..................... | 365/225 |
| 5,453,959 A * | 9/1995 | Sakuta et al. ................ | 365/222 |
| 6,246,619 B1 | 6/2001 | Ematrudo et al. .......... | 365/201 |
| 6,392,948 B1 | 5/2002 | Lee ............................. | 365/222 |

* cited by examiner

*Primary Examiner*—Huan Hoang
(74) *Attorney, Agent, or Firm*—Moser, Patterson & Sheridan, LLP

(57) ABSTRACT

Methods, apparatus, and systems for trimming a periodic self-refresh timing signal of a dynamic random access memory (DRAM) device are described. The self-refresh timing signal may be generated by an internal self-refresh circuit including a programmable counter driven by an oscillator. The self-refresh timing signal may be trimmed by generating a trim value for programming the programmable counter based on an externally supplied timing signal.

35 Claims, 6 Drawing Sheets

METHOD AND IMPLEMENTATION OF AN ON-CHIP SELF REFRESH FEATURE

BACKGROUND OF THE INVENTION

1. Field of the Invention

Embodiments of the present invention generally relate to dynamic random access memory (DRAM) devices and, more particularly, to internal circuits of DRAM devices that generate self-refresh signals.

2. Description of the Related Art

Dynamic random access memory (DRAM) devices store data in memory elements that have an associated retention time. DRAM devices are referred to as dynamic because if the memory elements are not refreshed (e.g., accessed) within the retention time, the data stored in the memory element may be lost. During normal operating conditions, a memory controller connected to a DRAM device typically generates periodic signals to refresh the memory elements in order to retain the data. However, for special operating conditions, such as a low power mode, the memory controller may be shut down and unable to generate the period refresh signals. Typically, to maintain data in such special operating conditions, DRAM devices may be placed in a self-refresh mode, in which the memory elements are refreshed by signals generated by an internal self-refresh circuit.

The self-refresh circuit generally includes a timing circuit and address decoding logic configured to access all memory elements at least once within the retention time. The timing circuit typically includes a programmable counter driven by an oscillator to generate a self-refresh timing signal to initiate a self-refresh sequence in which a memory element selected by the address decoding logic is accessed. The address decoding logic may select a different memory element for each access. Due to variations in materials and manufacturing processes, the oscillator frequency may vary which may, in turn, result in variations in the frequency of the self-refresh signal. If these variations are great enough, the frequency of the self-refresh signal may be insufficient to ensure each memory element is accessed within the retention time, and data may be lost.

Therefore, to account for variations in the oscillator frequency, the self-refresh circuit is typically calibrated (or trimmed) during the manufacturing process. Because the frequency of the self-refresh signal is generally equal to the oscillator frequency multiplied by a pre-programmed count loaded into the programmable counter, variations in the oscillator frequency may be compensated for by varying the pre-programmed count accordingly. Conventionally, to adjust this time during the manufacturing process, a DRAM device is placed into a special test mode in which the frequency of the self-refresh signal may be measured externally by a testing device (e.g., the self-refresh signal may be driven onto an output pin during the special test mode).

Generally, the testing device determines an optimal value for the pre-programmed count based on the measured frequency of the self-refresh signal. The optimal value is calculated to ensure that the frequency of the self-refresh signal is sufficient to ensure each memory element will be addressed within the retention time. Once calculated, the optimal value is permanently stored in non-volatile storage elements, such as fuses, on the DRAM device. After this initial calibration (e.g., on future power-up sequences), the DRAM device may then load the pre-programmed count from the non-volatile storage. Because the oscillator frequency for each DRAM device may vary independently, the self-refresh frequency for each DRAM is typically measured and trimmed individually. Therefore, self-refresh calibration tends to add considerable time to a DRAM manufacturing process, which may limit manufacturing throughput.

Accordingly, what is needed is an improved method and apparatus for self-refresh calibration of DRAM devices that results in reduced calibration time and increased manufacturing throughput.

SUMMARY OF THE INVENTION

Embodiments of the present invention generally provide methods, apparatus, and systems for trimming a periodic self-refresh timing signal of a dynamic random access memory (DRAM) device.

For one embodiment, a method for internally trimming a periodic self-refresh timing signal of a dynamic random access memory (DRAM) device generated by a programmable counter driven by an oscillator generally includes receiving a reference timing signal supplied from a device external to the DRAM device and internally determining a trim value for programming the programmable counter based on the reference timing signal.

For one embodiment, a method for internally trimming a periodic self-refresh timing signal of a dynamic random access memory (DRAM) device generated by a programmable counter driven by an oscillator generally includes receiving a reference timing signal supplied from a device external to the DRAM device and internally determining a trim value for programming the programmable counter by comparing a period of the reference timing signal to a period of the self-refresh timing signal.

For one embodiment, a dynamic random access memory (DRAM) device generally includes a self-refresh circuit having a programmable counter driven by an oscillator for generating a periodic self-refresh timing signal and a self-trim circuit configured to receive a reference timing signal supplied by a device external to the DRAM device and to generate a trim value for programming the programmable counter based on a period of the reference timing signal.

For one embodiment, a dynamic random access memory (DRAM) device generally includes a self-refresh circuit having a programmable counter driven by an oscillator for generating a periodic self-refresh timing signal and a self-trim circuit configured to measure a period of a reference timing signal supplied by a device external to the DRAM device and to generate a trim value for programming the programmable counter based on the measured period.

For one embodiment, a system for calibrating dynamic random access memory (DRAM) devices generally includes a testing device configured to generate a periodic reference timing signal and one or more DRAM devices coupled to the testing device via a bus, each having a self-refresh circuit with a programmable counter driven by an oscillator for generating a periodic self-refresh timing signal and a self-trim circuit configured to receive a reference timing signal supplied by a device external to the DRAM device and to generate a trim value for programming the programmable counter based on a period of the reference timing signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides methods, apparatus, and systems for trimming a self-refresh timing signal of a DRAM based on an externally supplied timing signal. The external timing signal may be supplied to several DRAM devices simultaneously, allowing the self-refresh signals of the several DRAM devices to be trimmed in parallel, thus reducing calibration time which may increase manufacturing throughput.

Figure 1:
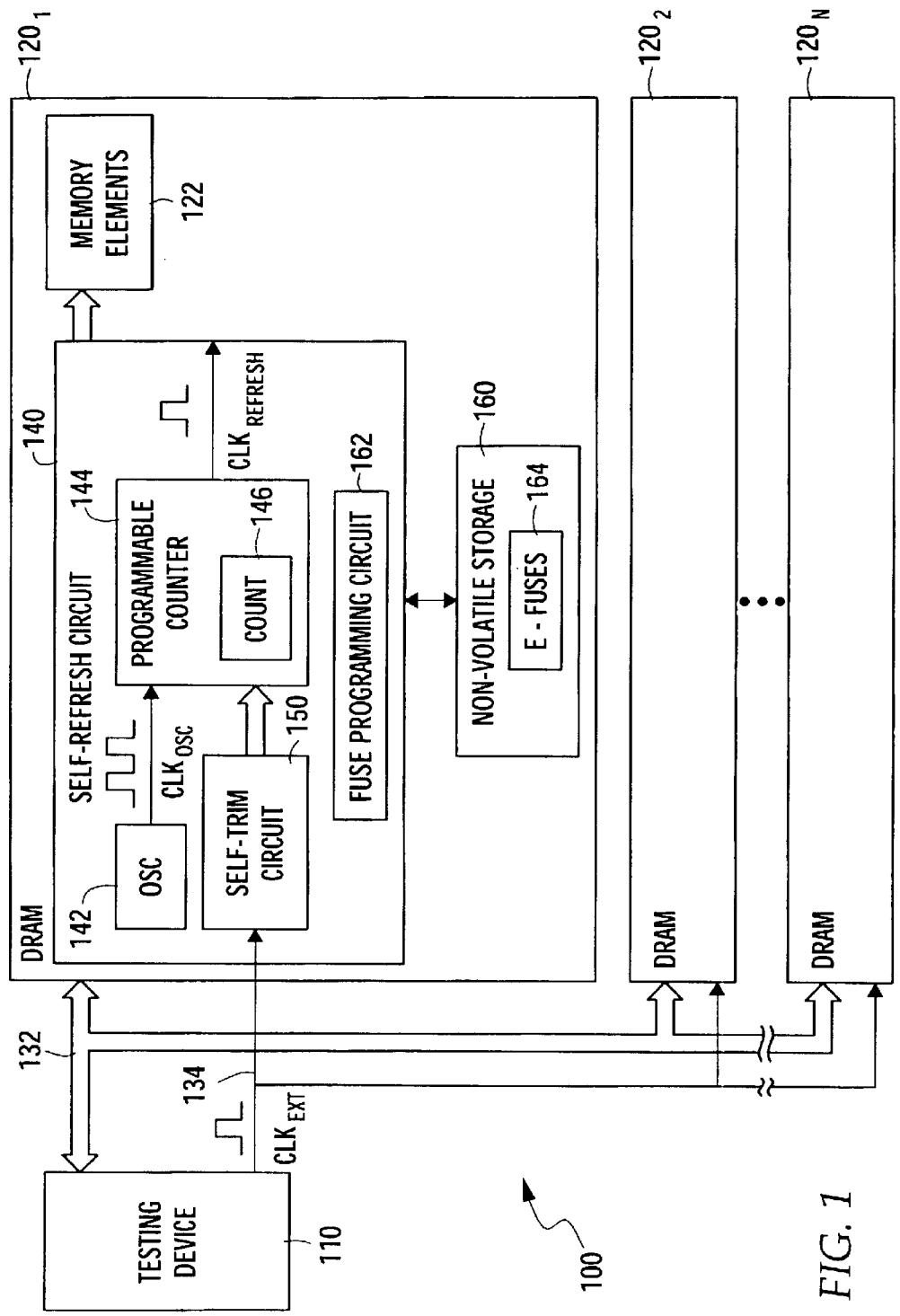
FIG. 1 illustrates an exemplary DRAM testing system according to an embodiment of the present invention.

FIG. 1 illustrates an exemplary DRAM testing system 100 according to an embodiment of the present invention. As illustrated, the testing system 100 may include a testing device 110 and a plurality of DRAM devices $120_1$, $120_2$, ... $120_N$ (collectively, DRAM devices 120). The testing device 110 may include any suitable components (e.g., computers, interface circuitry, and software) for performing a variety of operations to test, verify, and configure the DRAM devices 120. As illustrated, the testing device 110 may communicate with the DRAM devices 120 via a bus 132, which may include any suitable combination of control lines, address lines, and data lines. For some embodiments, the bus 132 may include serial communication lines to reduce a number of lines required to interface with the test device 110. Reducing the number of lines required to interface with the testing device 110 may reduce the pin count of the DRAM devices 120, increase the number of pins available for other functions, and/or reduce the complexity of circuitry (e.g., multiplexing circuitry) required on the DRAM devices 120 to interface with the testing device 110.

As illustrated, the DRAM devices 120 may include a self-refresh circuit 140 configured to access memory elements 122 when the DRAM devices 120 are placed in a self-refresh mode. The self-refresh circuit 140 may include a programmable counter 144 driven by an oscillator 142. In general, the programmable counter 144 counts pulses supplied by the oscillator 142 until a pre-programmed count is reached. Once the number of pulses counted has reached the programmable count, a programmable counter 144 generates an output pulse (e.g., a self-refresh signal) that may be used to initiate a self-refresh cycle. Accordingly, the self-refresh signal may have a period ($T_{REFRESH}$) substantially equal to a period of the signal generated by the oscillator 142 ($T_{OSC}$) multiplied by the pre-programmed count.

However, it will be recognized by one skilled in the art that programmable counters may vary. For example, some programmable counters may generate an output pulse when the pre-programmed count is reached, while others may generate an output pulse when the pre-programmed count is exceeded. In the latter case, $T_{REFRESH}$ may be substantially equal to $T_{OSC}$ multiplied by the a value of the pre-programmed count incremented by 1. Further, programmable counters may differ in how the pre-programmed count is loaded. For example, some programmable counters may have inputs that must be held high or low with the pre-programmed count, while other programmable counters may have a register 146 for storing the pre-programmed count.

Regardless of the exact implementation of the programmable counter 144, variations in a period $T_{OSC}$ of the signal generated by the oscillator 142 due to variations in materials and manufacturing processes may result in variations in a period $T_{REFRESH}$ of the self refresh signal generated by the programmable counter 144. These variations may be compensated for by adjusting a value of the pre-programmed count to an optimal value (a trim value) in order to trim the self-refresh signal to obtain a desired period. As previously described, conventional techniques for trimming the self-refresh signal include external measurement of the period of the self-refresh signal and calculating a trim value based on the externally measured period. Because each DRAM device may vary, using this technique, the self-refresh period of each DRAM device needs to measured and trimmed individually.

In contrast, the DRAM devices 120 include a self-trim circuit 150 that may allow the self-refresh signals of the DRAM devices 120 to be trimmed at the same time (i.e., in parallel). For example, the self-refresh signals of hundreds or thousands of DRAM devices 120 may be trimmed in parallel, which may greatly reduce calibration time and increase manufacturing throughput. The self-trim circuit 150 may be configured to generate a trim value based on a timing signal ($CLK_{EXT}$) supplied by the testing device 110 to each of the DRAM devices 120 in parallel via line 134. The trim value generated by the self-trim circuit 150 may be used as the pre-programmed count of the programmable counter 144 to generate a self-refresh signal having a period ($T_{REFRESH}$) substantially equal to or slightly less than a period ($T_{EXT}$) of the externally supplied timing signal.

In other words, the period $T_{EXT}$ of $CLK_{EXT}$, may be controlled (by the testing device 110) to ensure that the period $T_{REFRESH}$ of the self-refresh signal generated by the programmable counter 144 is sufficiently low to allow the self-refresh circuit 140 to access each of the memory elements 122 within a specified retention time. Because each memory element 122 needs to be addressed within the retention time, the value of $T_{EXT}$ may be determined not only by the retention time but by the number of memory elements 122 in the DRAM devices 120. Accordingly, the testing device 110 may be configured to generate external timing signals having different periods in order to calibrate DRAM devices 120 having a different number of memory elements (i.e., different storage capacities).

The trim value may be generated by the self-trim circuit 150 while the DRAM devices 120 are in a special self-trim mode. For example, the self-trim mode may be entered via a command sequence issued to the DRAM devices 120 via the bus 132. Once generated, the trim value may be stored in a non-volatile storage 160. Accordingly, during normal operation (e.g., after exiting the self-trim mode or on future power-up sequences) the stored trim-value may be accessed from the non-volatile storage 160 for use as the preprogrammed count of the programmable counter 144.

The non-volatile storage 160 may comprise any suitable non-volatile storage element or combination of non-volatile storage elements. For some embodiments, the non-volatile storage 160 may comprise conventional fuses (e.g., laser fuses) that may be blown via an external apparatus (e.g., a laser) after the self-trim mode. In such a case, the testing device 110 may include a laser apparatus for blowing the fuses to store the trim value. In order to determine which of the fuses to blow for each DRAM device 120, the testing device 110 may read the trim value from each DRAM device 120 via the bus 132 and burn the fuses on each DRAM device 120 individually.

Alternatively, for some embodiments, the non-volatile storage 160 may comprise electrically programmable fuses (eFuses) 164. The self-trim circuit 150 may include a fuse programming circuit 162 for programming the eFuses 164 to store the generated trim value without intervention of the testing device 110. For example, the self-trim circuit 150 may be configured to program the eFuses 164 with the programming circuit 162 automatically after generating the trim value, which may further reduce calibration time.

Figure 2:
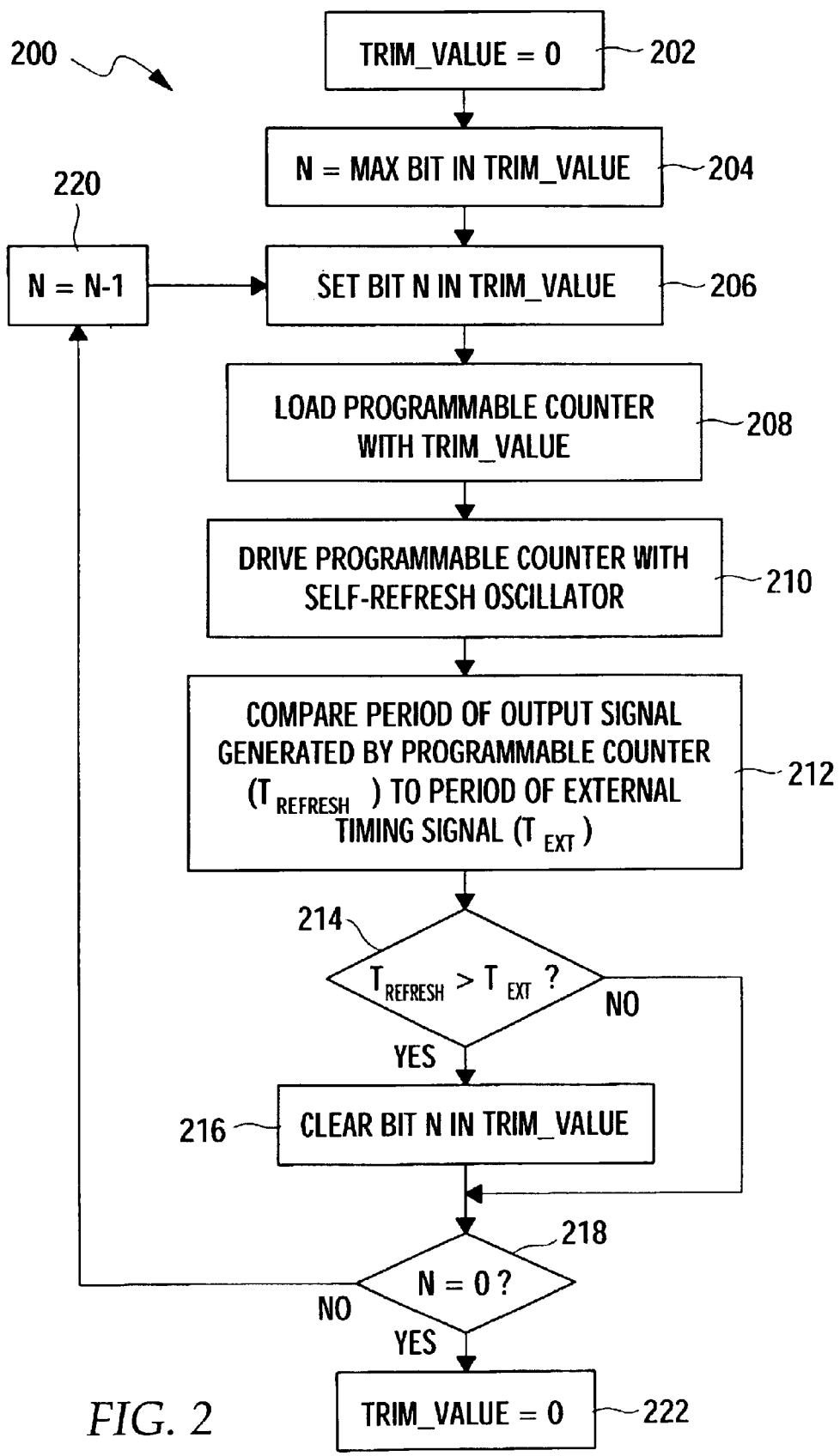
FIG. 2 illustrates exemplary operations for trimming a self-refresh timing signal according to an embodiment of the present invention.

For various embodiments, the self-trim circuit 150 may be configured to generate a trim value based on the externally supplied timing signal using different algorithms. For example, FIG. 2 illustrates exemplary operations 200 for generating a trim value according to an embodiment of the present invention. The operations 200 may be described with reference to FIG. 3, which illustrates one embodiment of a self-trim circuit 150 suitable for performing the operations 200 of FIG. 2. The operations 200 generate a trim value based on comparisons between the period $T_{REFRESH}$ of the self-refresh signal generated by the programmable counter 144 and the period $T_{EXT}$ of the externally supplied timing signal.

Figure 3:
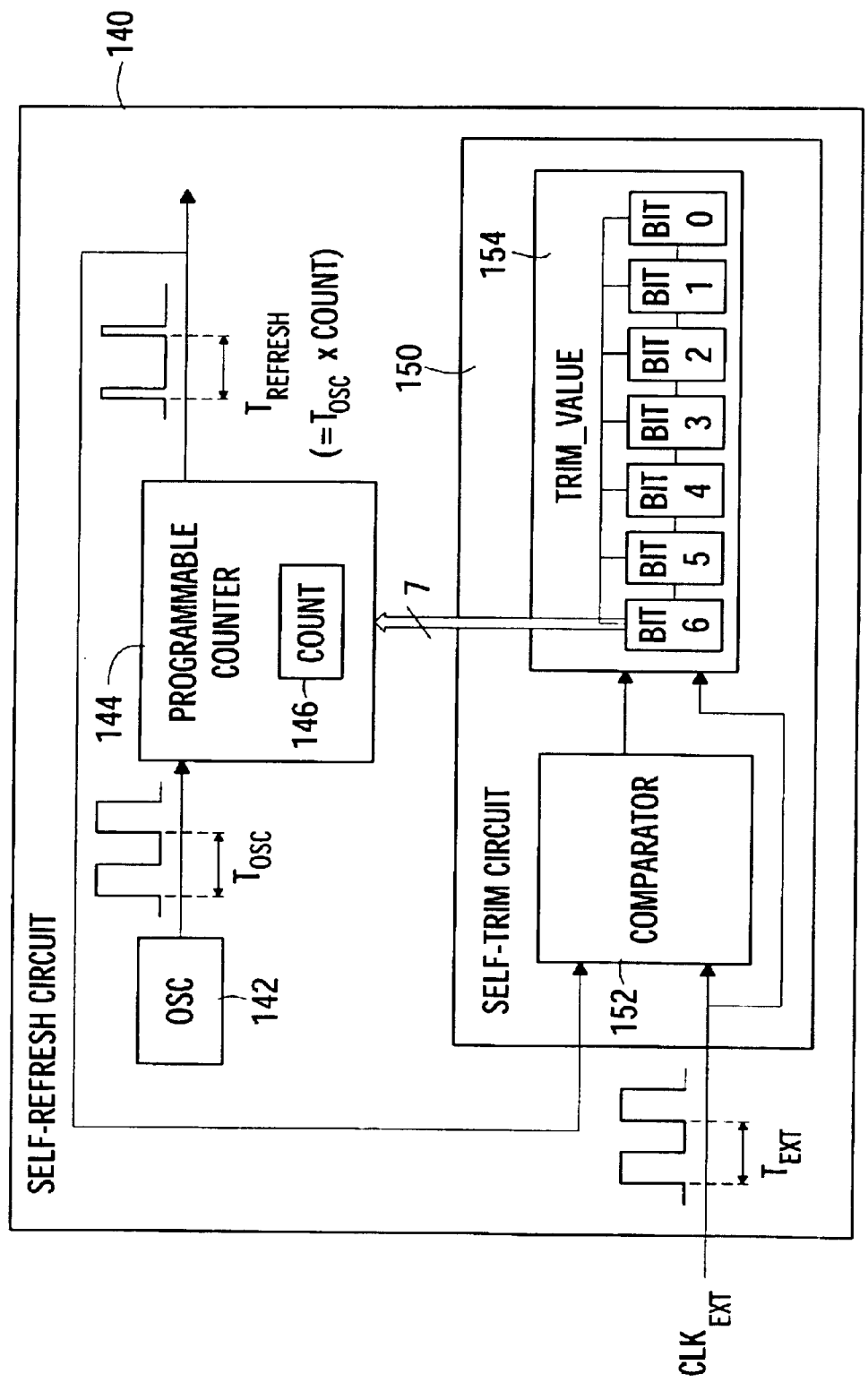
FIG. 3 illustrates an exemplary circuit suitable for trimming a self-refresh timing signal in accordance with the exemplary operations of FIG. 2.

At step 202, the trim value is initialized to zero. At step 204, a "bit pointer" value N is set to the maximum bit value in count. For example, as illustrated in FIG. 3, the trim value may have 7 bits (i.e., BITS6:0, allowing the trim value 154 to range from 0 to 127), so the value of N may be set to 6. Of course, the number of bits in the trim value may vary for different embodiments, for example, based on a range of self-refresh periods to be achieved with the self-refresh circuit which may be determined, for example, by the manufacturing tolerances of the oscillator 142.

Steps 206–220 represent looped operations performed for each bit in the trim value. In other words, the operations of steps 206–220 may be repeated as N is decremented from the maximum (i.e., the most significant) bit of trim value to 0 (i.e., the least significant bit).

At step 206, BIT N of the trim value is set (to 1), which has the affect increasing the trim value by $2^N$. For example, if N=6, the trim value is increased (from 0 initially) by 64. The self-trim circuit 150 may include any suitable circuitry for maintaining and manipulating the trim value.

At step 208, the programmable counter 144 is loaded with the trim value (i.e., the pre-programmed count is set to the trim value). As previously described, setting the preprogrammed count may include providing signals to inputs of the programmable counter 144 or writing the trim value to the register 146. At step 210, the programmable counter 144 is driven with the self-refresh oscillator 142. As previously described, the period $T_{REFRESH}$ of the refresh signal generated by the programmable counter 144 is generally equally to the period $T_{OSC}$ of the signal generated by the self-refresh oscillator 142 multiplied by the programmable count, which has been set to the trim value.

At step 212, the period $T_{REFRESH}$ of the self-refresh signal generated by the programmable counter 144 is compared against the period $T_{EXT}$ of the external timing signal. At step 214, if $T_{REFRESH} > T_{EXT}$, (i.e., the period of the self-refresh signal has exceeded the externally supplied timing signal) BIT N of the trim value is cleared at step 216. In other words, the trim value is reduced by $2^N$, which will reduce the period $T_{REFRESH}$ of the self-refresh signal generated by the programmable counter 144. On the other hand, if the period of the self-refresh signal has not exceeded the externally supplied timing signal (i.e., $T_{REFRESH} < T_{EXT}$), BIT N of the trim value is maintained set.

The self-trim circuit 150 may include any suitable circuitry for comparing $T_{REFRESH}$ to $T_{EXT}$. For example, the self-trim circuit 150 may include a comparator 152 (e.g., a phase-detector) configured to detect rising and/or falling edges of the external timing signal and the self-refresh signal. For example, a rising edge of the external timing signal $CLK_{EXT}$ may trigger the self-trim circuit 150 to begin driving the programmable counter with the oscillator 142 (per step 210). The comparator 152 may also detect this rising edge of $CLK_{EXT}$. The comparator 152 may be configured to compare $T_{REFRESH}$ and $T_{EXT}$, for example, based on the next rising edge of the externally supplied signal and a first rising edge of the self-refresh signal. The comparator 152 may generate a signal to maintain (as set) and/or clear the BIT N in the register 154 based on the comparison. The signal may be latched into the register 154, for example, on a rising or falling edge of the external timing signal. The rising or falling edge may also advance the bit N to the next bit (i.e., step 220) to be set, and reset the oscillator and counter states until all bits in the trim value have been set and the corresponding refresh periods $T_{REFRESH}$ have been compared against $T_{EXT}$.

At step 218, a test is performed to determine if N=0 (i.e., the operations of steps 206–216 have been performed for all bits of the trim value). If not, the value of N is decremented at step 220 (i.e., to point to the next lower bit), and the operations continue at step 206 by setting the next lower BIT N. Accordingly, each time through the loop, the trim value is increased at step 206 by $2^N$, where N is decremented by 1 each time through the loop. In other words, if trim value 154 is a 7-bit value (having bits 0–6), setting bit 6 increments trim value by 64, setting bit 5 increments the trim value by 32, etc.

Finally, once the operations 206–218 have been performed for all the bits (i.e., N=0), the trim value 154 is stored at step 222. At this point, the trim value 154 should represent an optimal value for the register 146 of the programmable counter 144 that results in a self-refresh signal having a period that is the closest approximation to the period of the externally supplied signal as possible without exceeding it. As previously described, the period of the external signal may be chosen to ensure that the period of the self-refresh signal is sufficient for the self-refresh circuit 140 to access all memory elements of a DRAM within a specified retention time.

By performing the operations of steps 206–218 for each bit, starting with the most significant bit, an optimum trim value may be achieved asymptotically. In other words, the operations 200 are similar to a binary search algorithm.

Generally, in a binary search algorithm, a set of sorted elements is searched by iteratively comparing a desired element to a middle element to determine if the middle element is the desired element or if the desired element is in an upper half of elements (above the middle element) or a lower half of elements (below the middle element). For each iteration, the search is restricted to half of the previous elements until the desired element is found.

Figure 4:
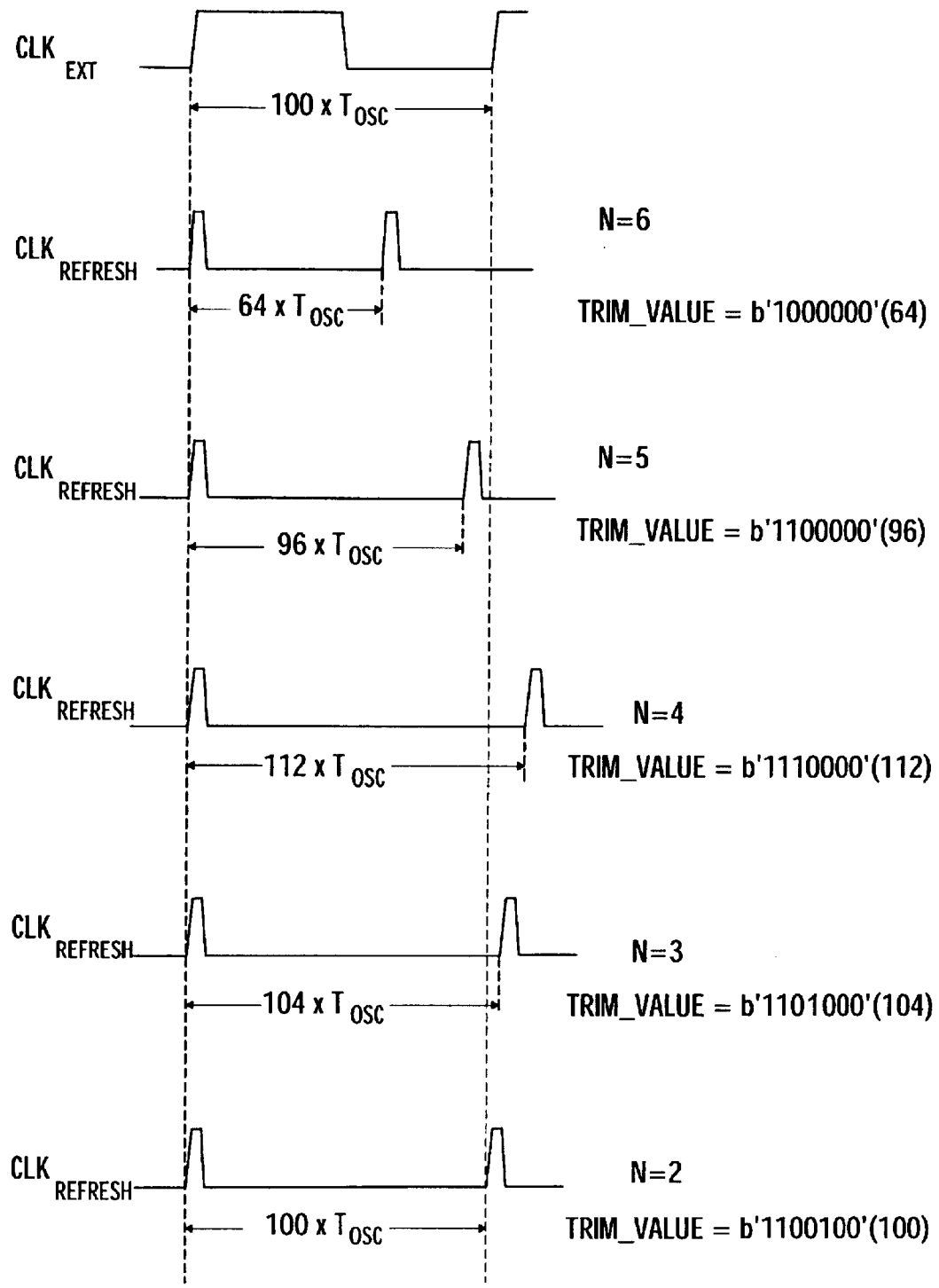
FIG. 4 illustrates timing diagrams for exemplary external timing signals and exemplary self-refresh signals generated using different trim values.

The manner in which the operations 200 achieve an optimum trim value is illustrated in FIG. 4, which shows an exemplary external timing signal $CLK_{EXT}$ and exemplary refresh timing signals $CLK_{REFRESH}$ for different trim values that may be generated at different times through the looped operations 206–218. For illustrative purposes only, in this example, $CLK_{EXT}$ has a period of 100*TOSC and the trim value is a 7 bit value.

The first time through the loop (N=6), BIT 6 is set, resulting in a trim value of 64. As illustrated, with a trim value of 64, the period of $CLK_{REFRESH}$ is much less than the period of $CLK_{EXT}$ and, therefore, BIT 6 remains set. The next time through the loop (N=5), BIT 5 is set, resulting in a trim value of 96. As illustrated, with a trim value of 96, the period of $CLK_{REFRESH}$ is still slightly less than the period of $CLK_{EXT}$ and, therefore, BIT 5 also remains set.

However, the next time through the loop (N=4), BIT 4 is set, resulting in a trim value of 112. As illustrated, with a trim value of 112, the period of $CLK_{REFRESH}$ is greater than the period of $CLK_{EXT}$ and, therefore, BIT 4 is cleared. Similarly, the next time through the loop (N=3), BIT 3 is set, resulting in a trim value of 104. As illustrated, with a trim value of 104, the period of $CLK_{REFRESH}$ is still slightly greater than the period of $CLK_{EXT}$ and, therefore, BIT 3 is also cleared.

The next time through the loop (N=2), BIT 2 is set, resulting in a trim value of 100. As illustrated, with a trim value of 100, the period of $CLK_{REFRESH}$ is substantially equal to the period of $CLK_{EXT}$ and, therefore, BIT 2 remains set. While not illustrated, in the final two times through the loop (N=1 and N=0), bits 1 and 0 are set, resulting in trim values of 102 and 101, respectively, which would each result in periods for $CLK_{REFRESH}$ slightly greater than a period of $CLK_{EXT}$. Accordingly, bits 1 and 0 would be cleared, so the final trim value would remain 100.

For other embodiments, however, variations of the operations 200 may be performed to determine an optimum trim value. As an example, $T_{REFRESH}$ and $T_{EXT}$ may be compared while the trim value is incremented from 0 to a maximum value. As soon as $T_{REFRESH}$ exceeds $T_{EXT}$ the operations may cease and the trim value may be (optionally decremented by 1 and) stored. Alternatively, $T_{REFRESH}$ and $T_{EXT}$ may be compared while the trim value is decremented from a maximum value to zero. For example, as soon as $T_{REFRESH}$ falls below $T_{EXT}$, the operations may cease and the trim value may be stored. As another example, rather than compare complete periods of $CLK_{REFRESH}$ and $CLK_{EXT}$, the self-trim circuit 150 may be configured to compare half-periods (e.g., the time between a rising edge and falling edge or the time between a falling edge and rising edge).

Figure 5:
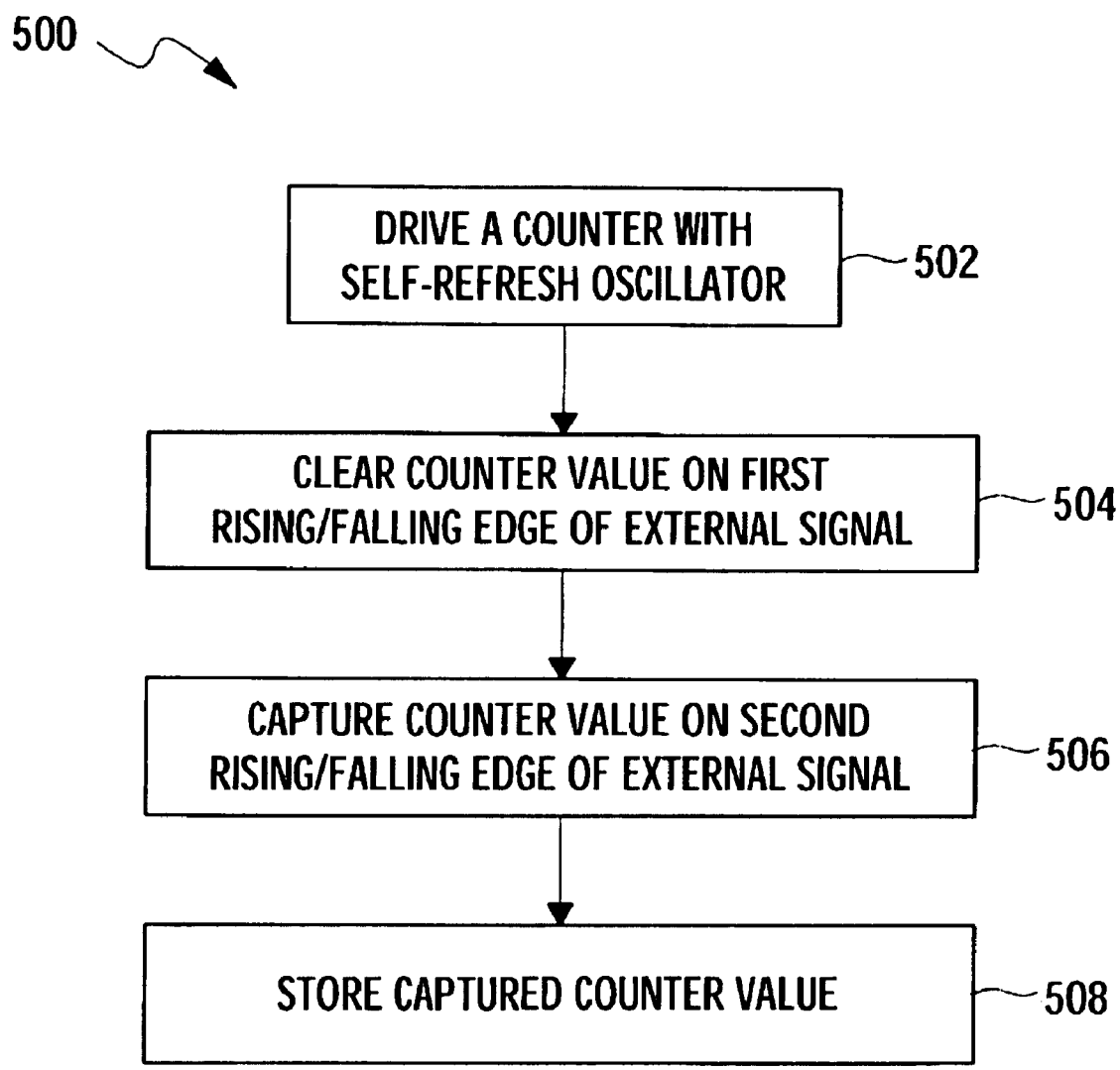
FIG. 5 illustrates exemplary operations for trimming a self-refresh timing signal according to another embodiment of the present invention.
Figure 6:
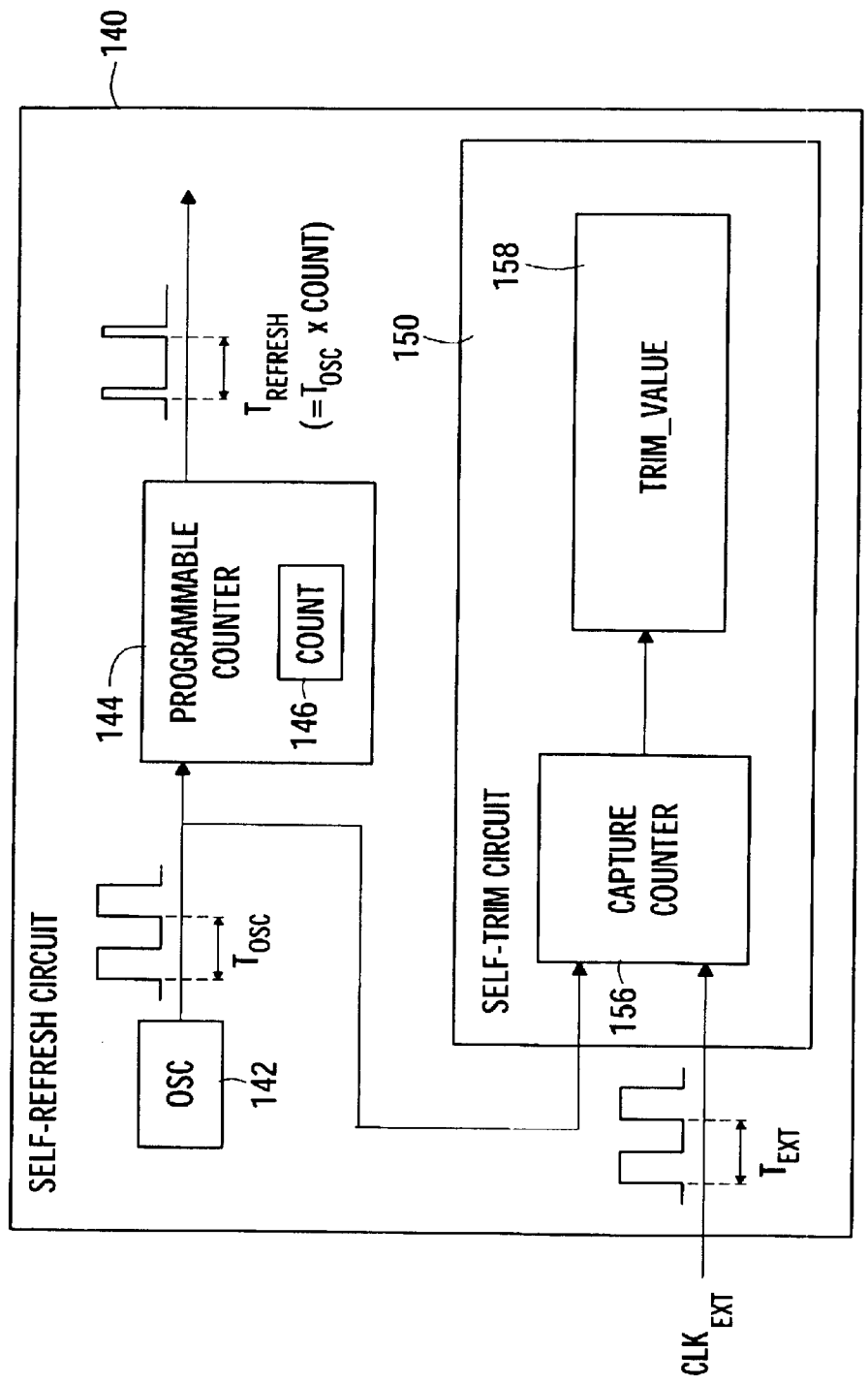
FIG. 6 illustrates an exemplary circuit suitable for trimming a self-refresh timing signal in accordance with the exemplary operations of FIG. 5.

Further, as an alternative to determining a trim value based on comparisons between $T_{REFRESH}$ and $T_{EXT}$, for some embodiments, a trim value may be determined by direct measurement of $T_{EXT}$. For example, FIG. 5 illustrates exemplary operations 500 for generating a trim value by direct measurement of $T_{EXT}$. The operations 500 may be described with reference to FIG. 6, which illustrates another embodiment of a self-trim circuit 150 suitable for performing the operations 500 of FIG. 5. As illustrated, the embodiment of the self-trim circuit 150 illustrated in FIG. 6 is similar to the embodiment illustrated in FIG. 3. However, rather than utilize a comparator 152 that receives the self-refresh signal as an input, the self-trim circuit 150 of FIG. 6 utilizes a capture counter 156 that receives the signal generated by the oscillator 142 as an input.

At step 502, the capture counter 156 is driven with the self-refresh oscillator 142. For example, the capture counter 156 may comprise a free-running counter that is incremented on each pulse received from the oscillator 142. At step 504, a value of the capture counter 156 is cleared on a first rising or falling edge of the externally supplied timing signal $CLK_{EXT}$. At step 506, the value of the capture counter 156 is captured on a second rising or falling edge of the externally supplied timing signal. As illustrated, the captured counter value may be transferred to a trim value register 158.

The captured counter value represents the number of pulses received from the oscillator 142 within one period $T_{EXT}$ of the externally supplied timing signal. Accordingly, this captured counter value may be written to the programmable count register 146 to ensure the period $T_{REFRESH}$ of the self refresh signal generated by the programmable counter 144 is substantially equal to the period $T_{EXT}$ of the externally supplied timing signal. Finally, at step 508, the captured counter value is stored. For example, as previously described, the captured counter value may be stored in any suitable non-volatile storage.

One skilled in the art will recognize that, for different embodiments, the capture counter 156 may be configured to measure the period of the externally supplied timing signal using different techniques. For example, the capture counter 156 may be configured to reset the value of the free-running counter on a first rising edge of the externally supplied timing signal. Alternatively, the free-running counter may be held in a reset condition, and started upon a rising edge of the externally supplied timing signal. For still other embodiments, the value of the free-running counter may not be reset. Instead, the value of the free-running counter may be captured on first and second rising edges of the externally supplied timing signal. The period of the externally supplied timing signal may then be calculated based on the difference of the first and second timing signals.

Further, rather than measure a full period (e.g., between two rising edges or between two falling edges, the capture counter may measure a half period (e.g., between a rising edge and a falling edge or between a falling edge and a rising edge. A value for the full period may be generated by multiplying the captured value for the half period by two (e.g., by a logical shift left). While a bit of resolution may be lost due to a logical shift left, the value resultant from the shift may be a close enough approximation, and any lost bit (assuming a zero is shifted in), will result in a lesser trim value and a corresponding shorter $T_{REFRESH}$, which may ensure each memory element is addressed within the specified retention time. Similarly, the reference timing signal $CLK_{EXT}$ may have a frequency other than the desired self-refresh frequency. For example, the reference timing signal may be one half a desired self-refresh frequency or twice the desired self-refresh frequency. Regardless, the self-trim circuit 150 may be configured to generate an appropriate trim value, for example, by left or right logical shifts.

While specific embodiments of the present invention have been described above with reference to self-refresh circuits of DRAM devices, it will be appreciated that embodiments of the present invention may be used to self-trim any type of internal timing circuits used in other type integrated circuits (ICs), such as microprocessors, or system-on-chip devices that integrate memory and microprocessor functions.

While the foregoing is directed to embodiments of the present invention, other and further embodiments of the invention may be devised without departing from the basic scope thereof, and the scope thereof is determined by the claims that follow.

What is claimed is:

1. A method for internally trimming a periodic self-refresh timing signal of a dynamic random access memory (DRAM) device generated by a programmable counter driven by an oscillator, comprising:
   receiving a reference timing signal supplied from a device external to the DRAM device; and
   internally determining a trim value for programming the programmable counter based on the reference timing signal.

2. The method of claim 1, wherein internally determining a trim value for programming the programmable counter based on the reference timing signal comprises measuring a period of the reference timing signal.

3. The method of claim 2, wherein measuring a period of the reference timing signal comprises measuring the period of the reference timing signal with a capture counter driven by the oscillator.

4. The method of claim 3, wherein measuring the period of the reference timing signal with the capture counter comprises capturing a value of the counter on a rising or falling edge of the reference timing signal.

5. The method of claim 4, wherein the captured value corresponds to a half period of the reference timing signal.

6. The method of claim 1, wherein a period of the reference timing signal is approximately equal to a period of the self-refresh timing signal generated by the programmable counter programmed with the trim value.

7. The method of claim 1, further comprising storing the trim value in non-volatile storage.

8. The method of claim 7, wherein the storing comprises storing the trim value in non-volatile storage by the DRAM device without external intervention.

9. The method of claim 8, wherein storing the value to non-volatile storage comprises programming electrically programmable fuses.

10. A method for internally trimming a periodic self-refresh timing signal of a dynamic random access memory (DRAM) device generated by a programmable counter driven by an oscillator, comprising:
    receiving a reference timing signal supplied from a device external to the DRAM device; and
    internally determining a trim value for programming the programmable counter by comparing a period of the reference timing signal to a period of the self-refresh timing signal.

11. The method of claim 10, wherein internally determining a trim value for programming the programmable counter by comparing a period of the reference timing signal to a period of the self-refresh timing signal comprises:
    iteratively adjusting the trim value; and
    for each iteration, comparing a period of the self-refresh timing signal generated by the programmable counter programmed with the trim value to the period of the reference timing signal.

12. The method of claim 11, wherein:
    iteratively adjusting the trim value comprises, for each iteration, setting a bit in the trim value starting with the most significant bit; and
    the method further comprises, for each iteration, clearing the bit in response to determining the period of the self-refresh timing signal generated by the programmable counter programmed with the trim value, with the bit set, is greater than the period of the reference timing signal.

13. The method of claim 11, wherein iteratively adjusting the trim value comprises incrementing or decrementing the trim value.

14. The method of claim 10, further comprising storing the trim value in non-volatile storage.

15. The method of claim 14, wherein the storing comprises storing the trim value in non-volatile storage by the DRAM device without external intervention.

16. The method of claim 15, wherein storing the value to non-volatile storage comprises programming electrically programmable fuses.

17. A dynamic random access memory (DRAM) device comprising:
    a self-refresh circuit comprising a programmable counter driven by an oscillator for generating a periodic self-refresh timing signal; and
    a self-trim circuit configured to receive a reference timing signal supplied by a device external to the DRAM device and to generate a trim value for programming the programmable counter based on a period of the reference timing signal.

18. The DRAM device of claim 17, wherein a period of the self-refresh timing signal generated by the programmable counter, when programmed with the generated trim value approximates the period of the reference timing signal.

19. The DRAM device of claim 17, wherein the self-trim circuit comprises circuitry to compare a period of the self-refresh timing signal to the period of the reference timing signal.

20. The DRAM device of claim 19, wherein the self-trim circuit comprises circuitry to iteratively adjust the trim value and, for each iteration, compare the period of the self-refresh timing signal to the period of the reference timing signal.

21. The DRAM device of claim 20, wherein the circuitry is configured to iteratively, for each bit in the trim value, starting with the most significant bit:
    (a) set the bit;
    (b) compare the period of the self-refresh signal generated by the programmable counter programmed with the trim value having the bit set; and
    (c) clear the bit in response to determining the period of the self-refresh timing signal generated by the programmable counter programmed with the trim value having the bit set is greater than the period of the reference timing signal.

22. The DRAM device of claim 20, wherein the self-trim circuit is further configured to store the trim value in non-volatile storage after performing the operations of steps (a)–(c) for each bit in the trim value.

23. The DRAM device of claim 22, wherein the non-volatile storage comprises electrically programmable fuses and the DRAM device further comprises a fuse programming circuit.

24. A dynamic random access memory (DRAM) device comprising:
    a self-refresh circuit comprising a programmable counter driven by an oscillator for generating a periodic self-refresh timing signal; and
    a self-trim circuit configured to measure a period of a reference timing signal supplied by a device external to the DRAM device and to generate a trim value for programming the programmable counter based on the measured period.

25. The DRAM device of claim 24, wherein the self-trim circuit comprises a capture counter driven by the oscillator.

26. The DRAM device of claim 25, wherein the self-trim circuit is configured to capture a value of the capture counter on a rising or falling edge of the reference timing signal, and to generate the trim value based on the captured value.

27. The DRAM device of claim 26, wherein the captured value represents less than a full period of the reference timing signal.

28. The DRAM device of claim 24, wherein the self-trim circuit is further configured to store the generated trim value in non-volatile storage.

29. The DRAM device of claim 28, wherein the non-volatile storage comprises electrically programmable fuses and the DRAM device further comprises a fuse programming circuit for storing the generated trim value by programming the electrically programmable fuses.

30. A system for calibrating dynamic random access memory (DRAM) devices, comprising:
  a testing device configured to generate a reference timing signal; and
  one or more DRAM devices coupled to the testing device via a bus, each comprising a self-refresh circuit having a programmable counter driven by an oscillator for generating a periodic self-refresh timing signal and a self-trim circuit configured to receive the reference timing signal generated by the testing device and to generate a trim value for programming the programmable counter based on a period of the reference timing signal.

31. The system of claim 30, wherein the self trim circuit is configured to measure a period of the reference timing signal and generate the trim value based on the measured period.

32. The system of claim 30, wherein the self-trim circuit is configured to iteratively adjust the trim value and, for each iteration, compare the period of the self-refresh timing signal to the period of the reference timing signal.

33. The system of claim 30, wherein the testing device is further configured to read the trim value from each DRAM device and store the trim value read from each DRAM device in fuses located in each device.

34. The system of claim 30, wherein the self-trim circuit is further configured to store the generated trim value in non-volatile storage.

35. The system of claim 34, wherein the non-volatile storage comprises electrically programmable fuses and the DRAM device further comprises a fuse programming circuit fo storing the generated trim value by programming the electrically programmable fuses.

* * * * *